(12) United States Patent
Kim et al.

(10) Patent No.: US 8,946,687 B2
(45) Date of Patent: Feb. 3, 2015

(54) ORGANIC LIGHT EMITTING DISPLAY DEVICES AND METHODS OF MANUFACTURING ORGANIC LIGHT EMITTING DISPLAY DEVICES

(75) Inventors: Young-Dae Kim, Yongin (KR); Jang-Soon Im, Yongin (KR); Il-Jeong Lee, Yongin (KR); Sang-Bong Lee, Yongin (KR)

(73) Assignee: Samsung Display Co., Ltd. (KR)

( * ) Notice: Subject to any disclaimer, the term of this patent is extended or adjusted under 35 U.S.C. 154(b) by 311 days.

(21) Appl. No.: 13/473,412

(22) Filed: May 16, 2012

(65) Prior Publication Data

US 2013/0001533 A1  Jan. 3, 2013

(30) Foreign Application Priority Data

Jun. 28, 2011  (KR) .................. 10-2011-0062891

(51) Int. Cl.
- *H01L 29/08* (2006.01)
- *H01L 27/32* (2006.01)

(52) U.S. Cl.
CPC ................................. *H01L 27/3248* (2013.01)
USPC ............................................. 257/40; 257/59

(58) Field of Classification Search
USPC .................................................... 257/40, 59
See application file for complete search history.

(56) References Cited

U.S. PATENT DOCUMENTS

| | | | |
|---|---|---|---|
| 2009/0315450 A1* | 12/2009 | Kim et al. | 313/504 |
| 2010/0164842 A1 | 7/2010 | Ishihara et al. | |
| 2011/0031497 A1* | 2/2011 | Yamazaki et al. | 257/59 |

FOREIGN PATENT DOCUMENTS

| | | |
|---|---|---|
| KR | 10 2005 0036627 | 4/2005 |
| KR | 10 2006 0044256 | 5/2006 |

\* cited by examiner

*Primary Examiner* — Douglas Menz
(74) *Attorney, Agent, or Firm* — Knobbe Martens Olson & Bear LLP

(57) ABSTRACT

An organic light emitting display device is provided. Thin film transistors may be located on a substrate. An insulating interlayer having a first contact hole to a third contact hole may be disposed on the substrate. First electrodes electrically connecting the thin film transistors may be located on the insulating interlayer and sidewalls of the first to the third contact holes. A pixel defining layer may be disposed on the insulating interlayer, portions of the first electrodes and the sidewalls of the first to the third contact holes. Light emitting structures may be disposed on the first electrodes in pixel regions. A second electrode may be located on the light emitting structures. Planarization patterns may be disposed on the pixel defining layer to fill the first and the second contact holes. A spacer may be disposed on the pixel defining layer to fill the third contact hole.

20 Claims, 4 Drawing Sheets

ORGANIC LIGHT EMITTING DISPLAY DEVICES AND METHODS OF MANUFACTURING ORGANIC LIGHT EMITTING DISPLAY DEVICES

CROSS-REFERENCE TO RELATED APPLICATIONS

This application claims priority under 35 USC §119 to Korean Patent Application No. 10-2011-0062891, filed on Jun. 28, 2011 in the Korean Intellectual Property Office (KIPO), the contents of which are herein incorporated by reference in their entirety.

BACKGROUND

1. Field

This disclosure relates to organic light emitting display (OLED) devices and methods of manufacturing organic light emitting display devices. More particularly, some embodiments relate to organic light emitting display devices including spacers and planarization patterns, and methods of manufacturing organic light emitting display devices including spacers and planarization patterns.

2. Description of the Related Technology

An organic light emitting display (OLED) device may usually include a thin film transistor (TFT), a pixel electrode, a light emitting structure and a common electrode, which are formed on a substrate. The light emitting structure may include an emission layer (EL) generating a white color of light, a red color of light, a green color of light or a blue color of light. The light emitting structure may additionally include a hole injection layer (HIL), a hole transferring layer (HTL), an electron transferring layer (ETL), an electron injection layer (EIL), and other features known by those skilled in the field of OLED devices.

The organic emitting structure may be generally formed by a laser induced thermal imaging (LITI) process. In this process, a donor substrate including an organic transfer layer may be provided on the pixel electrode of the organic light emitting display device, and then the organic transfer layer may be transferred to a pixel region by thermal energy of a laser. In this case, a contact hole formed adjacent to the pixel region may have a height difference, so that the organic transfer layer may not be uniformly transferred in the pixel region. Therefore, failures of pixels may easily occur in the organic light emitting display device.

SUMMARY OF CERTAIN INVENTIVE ASPECTS

Some embodiments provide an organic light emitting display device having improved reliability and enhanced structural stability without failure of pixels.

Some embodiments provide a method of manufacturing an organic light emitting display device having improved reliability and enhanced structural stability without failure of pixels.

According to one aspect, there is provided an organic light emitting display device. In the organic light emitting display device, thin film transistors may be disposed on a substrate. An insulating interlayer having a first contact hole to a third contact holes may be disposed on the substrate to partially expose thin film transistors. First electrodes electrically connecting the thin film transistors may be disposed on the insulating interlayer and sidewalls of the first to the third contact holes. A pixel defining layer defining pixel regions may be disposed on the insulating interlayer, portions of the first electrodes and sidewalls of the first to the third contact holes. Light emitting structures may be disposed on the first electrodes in the pixel region. A second electrode may be disposed on the light emitting structures. Planarization patterns may be disposed on the pixel defining layer and may fill the first and the second contact holes. A spacer may be disposed on the pixel defining layer and may fill the third contact hole.

An upper face of the spacer may be substantially higher than upper faces of the planarization patterns.

Upper faces of the planarization patterns may be substantially coplanar with an upper face of the pixel defining layer.

The spacer and the planarization patterns may include a material in common.

Each of the thin film transistors may include a semiconductor pattern having a channel region, a source region and a drain region disposed on the substrate, a gate insulation layer on the semiconductor pattern, a gate electrode on the gate insulation layer, a source electrode electrically connected to the source region, and a drain electrode electrically connected to the drain region.

According to another aspect, there is provided a method of manufacturing an organic light emitting display device. In the method, thin film transistors may be formed on a substrate. An insulating interlayer may be formed on the substrate to cover the thin film transistors. A first contact hole, a second contact hole and a third contact hole exposing electrodes of the thin film transistors may be formed through the insulating interlayer. First electrodes may be formed on the insulating interlayer, sidewalls of the first to the third contact holes and exposed electrodes of the thin film transistors. A pixel defining layer may be formed on the insulating interlayer to portions of the first electrodes. A first planarization pattern and a second planarization pattern may be formed on the pixel defining layer to fill the first and the second contact holes, respectively. Light emitting structures may be formed on exposed portions of the first electrodes. A second electrode may be formed on the light emitting structures.

A planarization layer may be formed on the pixel defining layer to fill the first contact hole and the second contact hole, and then the planarization layer may be patterned using a half-tone mask to form the first and the second planarization patterns filling the first and the second contact holes, respectively. In this case, the planarization layer may be formed on the pixel layer to fill the third contact hole, and then the planarization layer may be patterned to form the spacer that may substantially fill the third contact hole and may protrude over the third contact hole.

The first and the second planarization patterns in the first and the second contact holes may have substantially lever upper faces.

An upper face of the spacer may be substantially higher than upper faces of the first and the second planarization patterns.

A planarization layer may be formed on the pixel defining layer to fill the first to the third contact holes, and then the planarization layer may be patterned using a half-tone mask to form the first and the second planarization patterns and to form the spacer.

The planarization layer may be formed using a photosensitive material.

The half-tone mask may include a transmissive region, a light blocking region and transflective regions.

The planarization layer may be formed using a positive photosensitive material. The transflective regions of the half-tone mask may correspond to the first and the second contact holes. The light blocking region of the half-tone mask may correspond to the third contact hole. The transmissive region of the half-tone mask may correspond to a portion of the pixel defining layer where the first to the third contact holes are not formed.

The planarization layer may be formed using a negative photosensitive material. The transflective regions of the half-tone mask may correspond to the first and the second contact holes. The transmissive region of the half-tone mask may correspond to the third contact hole. The light blocking region of the half-tone mask may correspond to a portion of the pixel defining layer where the first to the third contact holes are not formed.

Upper faces of the first and the second planarization patterns may be substantially coplanar with an upper face of the pixel defining layer adjacent to the first and the second contact holes. An upper face of the spacer may be substantially higher than an upper face of the pixel defining layer adjacent to the third contact hole.

According to another aspect, there is provided an organic light emitting display device. In the organic light emitting display device, a substrate may have a red sub-pixel region, a green sub-pixel region and a blue sub-pixel region. A red luminescent region and a first contact hole may be disposed in the red sub-pixel region of the substrate. A green luminescent region and a second contact hole may be disposed in the green sub-pixel region of the substrate. A blue luminescent region and a third contact hole may be disposed in the blue sub-pixel region of the substrate. A first planarization pattern and a second planarization pattern having heights substantially the same as those of the first and the second contact holes may fill the first and the second contact holes, respectively. A spacer substantially protruding over the third contact hole may fill the third contact hole.

Thin film transistors may be provided on the substrate.

The spacer may include a material substantially the same as those of the first and the second planarization patterns.

Each of the spacer and the first and the second planarization patterns may include a photosensitive material.

According to some embodiments, the organic light emitting display device may include the first and the second planarization patterns substantially filling the first and the second contact holes, and may include the spacer substantially filling the third contact hole. Thus, the height different of the pixel defining layer around the first to the third contact holes may be prevented or considerably reduced. When the light emitting structures are obtained by a laser induced thermal imaging process, an organic transfer layer of a donor substrate may be uniformly and effectively transferred on the first electrodes and the pixel defining layer. Therefore, the organic light emitting display device may have uniform pixels without failure of the light emitting structures because of the first and the second planarization patterns. Additionally, the organic light emitting display device may ensure improved structural stability because of the spacer. Furthermore, the first and the second planarization patterns and the spacer may be simultaneously obtained, so that manufacturing processes for the organic light emitting display device may be simplified.

BRIEF DESCRIPTION OF THE DRAWINGS

Certain embodiments will be more clearly understood from the following detailed description taken in conjunction with the accompanying drawings.

FIG. 1 is a plan view illustrating an embodiment of an organic light emitting display device.

FIGS. 2 and 3 are cross-sectional views illustrating an embodiment of the organic light emitting display device.

FIGS. 4 to 10 are cross-sectional views illustrating an embodiment of a method of manufacturing an organic light emitting display device.

DETAILED DESCRIPTION OF CERTAIN INVENTIVE EMBODIMENTS

Figure 1:
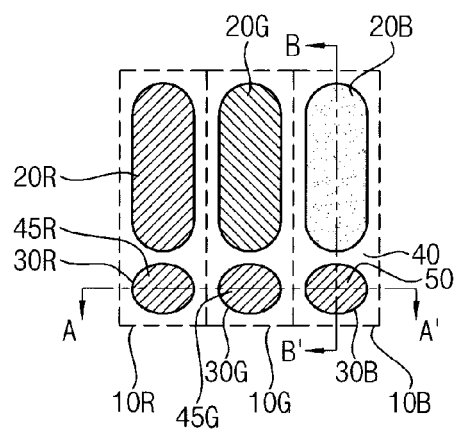
FIGS. 1 to 10 represent non-limiting embodiments as described herein.

Various embodiments will be described more fully hereinafter with reference to the accompanying drawings, in which some embodiments are shown. The invention may, however, be embodied in many different forms and should not be construed as limited to the embodiments set forth herein. Rather, these embodiments are provided so that this description will be thorough and complete, and will fully convey the scope of the invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer, or intervening elements or layers may be present. When an element is referred to as being "directly on," "directly connected to" or "directly coupled to" another element or layer, there are no intervening elements or layers present. Like numerals generally refer to like elements throughout. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments are described herein with reference to cross-sectional illustrations that are schematic illustrations of embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
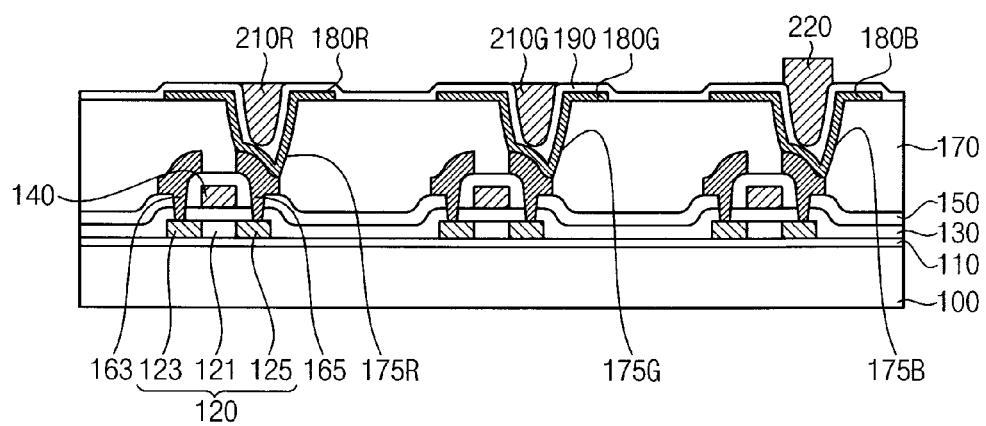
Figure 3:
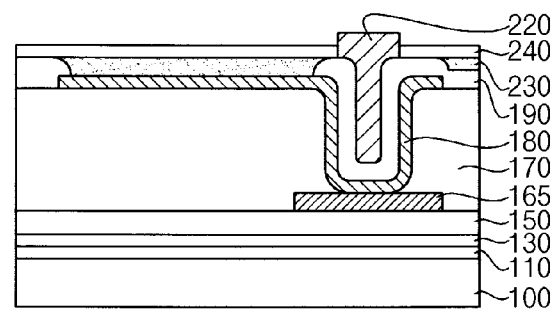

FIG. 1 is a plan view illustrating an embodiment of an organic light emitting display device. FIGS. 2 and 3 are cross-sectional views illustrating an embodiment of the organic light emitting display device. The organic light emitting display device illustrated in FIG. 2 may be obtained by taking a view along a line A-A' in FIG. 1, and the organic light emitting display device illustrated in FIG. 3 may be obtained by taking a view along a line B-B' in FIG. 1.

Referring to FIG. 1, the organic light emitting display device may have a pixel region divided into a red sub-pixel region 10R, a green sub-pixel region 10G and a blue sub-pixel region 10B. The red, the green and the blue sub-pixel regions 10R, 10G and 10B may be substantially parallel to one another. In some embodiments, the pixel region of the organic light emitting display device may further include a white sub-pixel region (not illustrated). In such embodiments, the white sub-pixel region may be arranged to be substantially parallel to the red, the green and the blue sub-pixel regions 10R, 10G and 10B. In other embodiments, the white sub-pixel region may be arranged to be adjacent to the red sub-pixel region 10R, the green sub-pixel region 10G and/or the blue sub-pixel region 10B. In some embodiments, each of the red, the green and the blue sub-pixel regions 10R, 10G and 10B may be located in a substantially tetragonal structure or a substantially pentagonal structure.

The red sub-pixel region 10R may include a red luminescent region 20R and an isolation pattern 40 substantially surrounding the red luminescent region 20R. The green sub-pixel region 10G may include a green luminescent region 20G and an isolation pattern 40 substantially surrounding the green luminescent region 20G. The blue sub-pixel region 10B may include a blue luminescent region 20B, a spacer 50 and the isolation pattern 40. The red, the green and the blue sub-pixel regions 10R, 10G and 10B may include a first contact hole 30R, a second contact hole 30G and a third contact hole 30B, respectively.

The spacer 50 may be disposed in the third contact hole 30B of the blue sub-pixel region 10B. The spacer 50 may be separated from the blue luminescent region 20B by the isolation pattern 40.

A first planarization pattern 45R may be disposed in the first contact hole 30R of the red sub-pixel region 10R. A second planarization pattern 45G may be positioned in the second contact hole 30G of the green sub-pixel region 10G.

The organic light emitting display device illustrated in FIG. 1 may include the spacer 50 disposed in the third contact hole 30B of the blue sub-pixel region 10B. In other embodiments, a spacer (not illustrated) may be positioned in the second contact hole 30G of the green sub-pixel region 10G instead of the second planarization pattern 45G. In such embodiments, planarization patterns (not illustrated) may be provided in the first and the third contact holes 30R and 30B of the red and the blue sub-pixel regions 10R and 10B. In some embodiments, a spacer (not illustrated) may be located in the first contact hole 30R of the red sub-pixel region 10R instead of the first planarization pattern 45R. In such embodiments, planarization patterns (not illustrated) may be positioned in the second and the third contact holes 30G and 30B of the green and the blue sub-pixel regions 10G and 10B.

Referring to FIGS. 2 and 3, the organic light emitting display device may include a first substrate 100, a buffer layer 110, thin film transistors (TFTs), a first insulating interlayer 150, a second insulating interlayer 170, a first electrodes 180R, 180G and 180B, a pixel defining layer 190, a light emitting structure 230, a second electrode 240, a first planarization patterns 210R, a second planarization pattern 210G, a spacer 220.

The first substrate 100 may include a transparent substrate such as a glass substrate, a quartz substrate, a transparent ceramic substrate, a transparent plastic substrate, and the like. Examples of the transparent plastic substrate may include polyimide, acryl, polyethylene terephthalate (PET), polycarbonate, polyacrylate, polyether, and the like.

The buffer layer 110 may be disposed on the first substrate 100. The buffer layer 110 may prevent diffusion of impurities and/or metal atoms from the first substrate 100, and may adjust a heat transfer rate in a crystallization process for forming a semiconductor pattern 120. In some embodiments, the buffer layer 110 may include a silicon compound, such as, for example, silicon oxide (SiOx), silicon nitride (SiNx), silicon oxynitride (SiOxNy), and the like. The buffer layer 110 may have a single-layered structure or a multi-layered structure including at least one silicon compound film.

The thin film transistors may be provided on the first substrate 100. Each of the thin film transistors may include the semiconductor pattern 120, a gate insulation layer 130, a gate electrode 140, a source electrode 163 and a drain electrode 165. In some embodiments, the thin film transistors may include a switching transistor and a driving transistor provided on the first substrate 100. The switching transistor may provide data signals from a data line. The driving transistor may receive the data signals from the switching transistor and may control a current flowing toward the light emitting structure 230.

The semiconductor pattern 120 of each thin film transistor may include a source region 123, a drain region 125, and a channel region 121 located between the source and the drain regions 123 and 125. In some embodiments, the semiconductor pattern 120 may include polysilicon.

The gate insulation layer 130 may be disposed on the first substrate 100 to cover the semiconductor pattern 120. In some embodiments, the gate insulation layer 130 may include silicon oxide, metal oxide, and the like. Examples of metal oxide in the gate insulation layer 130 may include aluminum oxide (AlOx), hafnium oxide (HfOx), zirconium oxide (ZrOx), tantalum oxide (TaOx), and the like.

The gate electrode 140 may be located on the gate insulation layer 130. In some embodiments, the gate electrode 140 may include polysilicon and/or metal such as chrome (Cr), aluminum (Al), tantalum (Ta), molybdenum (Mo), titanium (Ti), tungsten (W), copper (Cu), silver (Ag), and the like. A gate line (not illustrated) may be disposed on the gate insulation layer 130. The gate line may make electrical contact with the gate electrode 140 and may extend on the gate insulation layer 130 in a predetermined direction.

The first insulating interlayer 150 may be positioned on the gate insulation layer 130 to cover the gate electrode 140. In some embodiments, the first insulating interlayer 150 may include a silicon compound such as silicon oxide, silicon nitride, silicon oxynitride, and the like.

The source and the drain electrodes 163 and 165 may be disposed on the first insulating interlayer 150. The source and the drain electrodes 163 and 165 may be electrically connected to the source and the drain regions 123 and 125 of the semiconductor pattern 120 through the first insulating interlayer 150 and the gate insulation layer 130. In some embodiments, each of the source and the drain electrodes 163 and 165 may include metal and/or alloy. In some embodiments, the source and the drain electrodes 163 and 165 may include chrome, aluminum, tantalum, molybdenum, titanium, tungsten, copper, silver, alloy thereof, and the like. These may be used alone or in a combination thereof.

The second insulating interlayer 170 may be disposed on the first insulating interlayer 150 to cover the source and the drain electrodes 163 and 165. First to third contact holes 175R, 175G and 175B may be formed through the second insulating interlayer 170 to expose the drain electrodes 165 of the thin film transistors. In some embodiments, the second insulating interlayer 170 may include an inorganic material, such as, for example, silicon oxide, silicon nitride, silicon oxynitride, and the like. In some embodiments, the second insulating interlayer 170 may include an organic material such as acryl-based resin, polyimide-based resin, siloxane-based resin, benzocyclobutene (BCB), and the like.

As illustrated in FIG. 2, the first electrodes 180R, 180G and 180B may be disposed on the second insulating interlayer 170 and on sidewalls of the first to the third contact holes 175R, 175G and 175B. The first electrodes 180R, 180G and 180B may be electrically connected to the drain electrodes 165 of the thin film transistors, respectively. Each of the first electrodes 180R, 180G and 180B may include a transparent conductive material and/or metal. In some embodiments, each of the first electrodes 180R, 180G and 180B may include indium tin oxide (ITO), zinc tin oxide (ZTO), indium zinc oxide (IZO), zinc oxide (ZnOx), gallium oxide (GaOx), tin oxide (SnOx), silver (Ag), aluminum (Al), platinum (Pt), gold (Au), chrome (Cr), tungsten (W), molybdenum (Mo), titanium (Ti), palladium (Pd), and the like. In various embodiments, each of the first electrodes 180R, 180G and 180B may have a single-layered structure or a multi-layered structure. In some embodiments, each of the first electrodes 180R, 180G and 180B may have a multi-layered structure including a first ITO film, a silver film and a second ITO film.

The pixel defining layer 190 may be positioned on the second insulating interlayer 170 and on portions of the first electrodes 180R, 180G and 180B. The pixel defining layer 190 may define the red luminescent region 20B, the green luminescent region 20G and the blue luminescent region 20B of the organic light emitting display device. The portions of the first electrodes 180R, 180G and 180B exposed by the pixel defining layer 190 may correspond to the red, the green and the blue luminescent regions 20R, 20G and 20B, respectively. The pixel defining layer 190 may include an organic material, such as, for example, polyacryl-based resin, epoxy-based resin, phenol-based resin, polyamide-based resin, polyimide-based resin, unsaturated polyester-based resin, polyphenylene-based resin, poly(phenylenesulfide)-based resin, benzocyclobutene (BCB), and the like. In some embodiments, the pixel defining layer 190 may include an inorganic material such as silicon oxide, silicon nitride, silicon oxynitride, and the like.

In some embodiments, the first to the third contact holes 175R, 175G and 175B may have depths substantially greater than thicknesses of the first electrodes 180R, 180G and 180B and the pixel defining layer 190. In such embodiments, the first electrodes 180R, 180G and 180B and the pixel defining layer 190 may be formed conformally along profiles of the first to the third contact holes 175R, 175G and 175B. Thus, upper faces of portions of the pixel defining layer 190 located on bottom faces of the first to the third contact holes 175R, 175G and 175B may be substantially lower than an upper face of a portion of the pixel defining layer 190 positioned on the second insulating interlayer 170. The pixel defining layer 190 may have a height difference at portions adjacent to the first to the third contact holes 175R, 175G and 175B. In some embodiments, the height difference of the pixel defining layer 190 may be in a range of about 1 μm to about 3 μm.

The first and the second planarization patterns 210R and 210G may be disposed on the pixel defining layer 190. The first and the second planarization patterns 210R and 210G may substantially fill the first contact hole 175R of the red sub-pixel region 10R and the second contact hole 175G of the green sub-pixel region 10G, respectively. Upper faces of the first and the second planarization patterns 210R and 210G may have levels substantially the same or similar to an upper face of the pixel defining layer 190. In some embodiments, each of the first and the second planarization patterns 210R and 210G may include polyacryl-based resin, epoxy-based resin, phenol-based resin, polyamide-based resin, polyimide-based resin, unsaturated polyester-based resin, polyphenylene-based resin, polyphenylenesulfide-based resin, benzocyclobutene, and the like. Height differences among the first and the second contact holes 175R and 175G and the pixel defining layer 190 may be compensated by the first and the second planarization patterns 210R and 210G, so that the light emitting structure 230 may be accurately transferred from an organic transfer layer of a donor substrate.

The spacer 220 may be disposed on the pixel defining layer 190. The spacer 220 may substantially fill the third contact hole 175B of the blue sub-pixel region 10B. An upper face of the spacer 220 may have a height substantially higher than that of the upper face of the pixel defining layer 190. When the spacer 220 protrudes over the upper face of the pixel defining layer 190, the spacer 220 may ensure a predetermined gap between the first substrate 100 and a second substrate (not illustrated) combined with the first substrate 100. Even if pressure or stress is applied to the second substrate, the organic light emitting display device may not be damaged by the spacer 220 to thereby ensure improved structural stability of the organic light emitting display device. In some embodiments, the spacer 220 may include polyacryl-based resin, epoxy-based resin, phenol-based resin, polyamide-based resin, polyimide-based resin, unsaturated polyester-based resin, polyphenylene-based resin, polyphenylenesulfide-based resin, benzocyclobutene, and the like. In some embodiments, the spacer 220 may include a material substantially the same as or substantially similar to those of the first and the second planarization patterns 210R and 210G.

The light emitting structures 230 may be respectively disposed on the portions of the first electrodes 180 exposed by the pixel defining layer 190. Each of the light emitting structures 230 may include a hole injection layer (HIL), a hole transporting layer (HTL), an emission layer (EL), an electron transporting layer (ETL), an electron injection layer (EIL), and the like. In some embodiments, the light emitting structure 230 located on the first electrode 180 in the red sub-pixel region 10R may include a red emission layer for generating a red color of light, and the light emitting structure 230 positioned on the first electrode 180 in the green sub-pixel region 10G may include a green emission layer for generating a green color of light. Further, the light emitting structure 230 disposed on the first electrode 180 in the blue sub-pixel region 10B may include a blue emission layer for generating a blue color of light.

As for the light emitting structure 230 of some embodiments, the hole injection layer may include arylamine-based compound, phthalocyanine compound, starburst-based amine compound, and the like. In some embodiments, the hole injection layer may include 4,4,4 tris(3-methylphenyleamino)triphenylamino (m-MTDATA), copper phthalocyanine (CuPC), 1,3,5-tris[4-(3-methylphenylamino)phenyl] benzene (m-MTDATB), and the like. The hole transporting layer may include arylenediamine derivatives, starburst type compound, biphenyldiamine derivates having a spiro-group or ladder-type compound. In some embodiments, the hole transporting layer may include N,N'-diphenyl-N,N'-bis(3-methylphenyl)-1,1'-biphenyl-4,4'diamine(TPD), N,N'-di(naphthalene-1-il)-N,N'-diphenyl benzidine (α-NPD), 4,4'-bis(1-naphthylphenylamino)biphenyl (NPB), and the like. The emission layer may include a host-type emission layer and dopant material doped in the host-type emission layer. In some embodiments, the host-type emission layer may include 4,4-N,N'-dicarbazole-biphenyl(CBP), bis(2-methyl-8-quinolinolato)-(4-phenylphenolato)aluminium (BAlq), 2,9-dimethyl-4,7-diphenyl-1,10-phenanthroline (BCP), N,N'-dicarbazolyl-1,4-dimethene-benzene (DCB), rubrene, distyryl arylene derivatives (DSA), oxydiazole derivatives, antracene derivatives, and the like. When the dopant material includes fluorescent dopants, the dopant material may include distyrylamine derivatives, pyrene derivatives, perylene derivatives, distyrylbiphenyl (DSBP) derivatives, 10-(2-benzothiazolyl)-2,3,6,7-tetrahydro-1,1,7,7,-tetramethyl 1-1H,5H,11H-[1] benzopyrano[6,7,8-ij]quinolizin-11-one (C545 T), quinacridone derivatives, 4-(dicyano-methylene)-2-t-butyl-6-(1,1,7,7-tetramethyl-julolidyl-9-enyl)-4H-pyran (DCJTB), 4-dicyano-methylene-2-methyl-6-p-dimethylamino-styrl-4H-pyran (DCM), and the like. When the dopant material includes phosphorescent dopants, the dopant material may include bis(3,5-difluoro-2-(2-pyridyl)phenyl-(2-carboxypyridyl)iridium (F2Irpic), PQIr, (F2 ppy)2Ir(tmd), Ir(piq)2(acac), tris(2-phenylpiridine)iridium(III) (Ir(PPy)3), Btp2Ir (acac), 2,3,7,8,12,13,17,18-Octaethyl-21H,23H-porphine, platinum(II) (PtOEP), and the like. The electron transporting layer may include TAZ, PBD, spiro-PBD, Alq3, BAlq, SAlq or and the electron injection layer may include LiF, Ga complex, Liq, CsF, and the like.

The second electrode 240 may be positioned on the pixel defining layer 190 and the light emitting structures 230. The second electrode 240 may include a transparent conductive material. In some embodiments, the second electrode 240 may include indium tin oxide, indium zinc oxide, zinc indium oxide, zinc oxide, tin oxide, gallium oxide, and the like. These may be used alone or in a combination thereof.

In some embodiments, the second electrode 240 may extend on the isolation pattern 40 from the red, the green and the blue luminescent regions 20R,20G and 20B. In some embodiments, the second electrode 240 may be located on only the red, the green and the blue luminescent regions 20R, 20G and 20B. In some embodiments, the second electrode 240 may be disposed on the light emitting structures 230 and portions of the pixel defining layer 190 (such as, for example, sidewalls of the pixel defining layer 190). Further, an upper face of the second electrode 240 may be substantially lower than an upper face of the spacer 220.

A protection layer (not illustrated) may be located on the second electrode 240. Further, the second substrate may be disposed on the protection layer and the spacer 220. The second substrate may be combined with the first substrate 100. In some embodiments, the spacer 220 may protrude over the second electrode 240 between the first substrate 100 and the second substrate.

In some embodiments, the organic light emitting display device may additionally include a storage capacitor provided on the first substrate 100. The storage capacitor may provide the thin film transistors with predetermined current when the switching transistor turns off.

According to some embodiments, the organic light emitting display device may include the first and second planarization patterns 210R and 210G substantially filling the first and the second contact holes 175R and 175G. The light emitting device may further include the spacer 220 substantially filling the third contact hole 175B. Therefore, the height difference of the pixel defining layer 190 around the contact holes 175R, 175G and 175B may be prevented or considerably reduced. When the light emitting structures 230 are obtained by a laser induced thermal imaging (LITI) process, the organic transfer layer of the donor substrate may be uniformly and effectively transferred on the first substrate 100 having the pixel defining layer 190. As a result, failures of pixels of the organic light emitting display device may be prevented and structural stability of the organic light emitting display device may be improved.

FIGS. 4 to 10 are cross-sectional views illustrating an embodiment of a method of manufacturing an organic light emitting display device.

Figure 4:
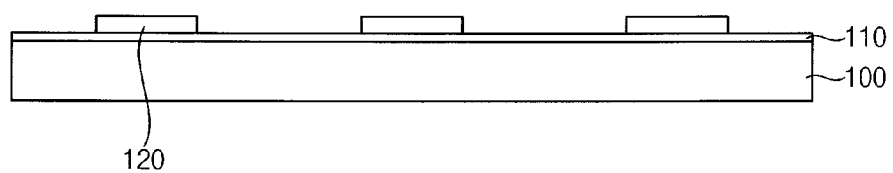

Referring to FIG. 4, a buffer layer 110 may be formed on a first substrate 100. The first substrate 100 may include a transparent insulation substrate. In some embodiments, the first substrate 100 may include a glass substrate, a quartz substrate, a transparent ceramic substrate, a transparent plastic substrate, and the like. The transparent plastic substrate for the first substrate 100 may include polyimide resin, acryl resin, polyacrylate resin, polycarbonate resin, polyether resin, polyethylene terephthalate resin, sulfonate resin, and the like. These may be used alone or in a combination thereof.

The buffer layer 110 may prevent diffusion of impurities and/or metal atoms from the first substrate 100 in subsequent processes. Additionally, the buffer layer 110 may control a heat transfer rate of a subsequent crystallization process for forming semiconductor patterns 120 to thereby improve informality of the semiconductor patterns 120. Furthermore, the buffer layer 110 may enhance flatness of the first substrate 100 when the first substrate 100 has a relatively rough surface. In some embodiments, the buffer layer 110 may be formed using a silicon compound. In various embodiments, the buffer layer 110 may be formed using silicon oxide, silicon nitride, silicon oxynitride, silicon oxycarbide, silicon carbonitride, and the like. These may be used alone or in a combination thereof. The buffer layer 110 may have a single-layered structure or a multi-layered structure.

The semiconductor patterns 120 may be formed on the buffer layer 110. In some embodiments, a semiconductor layer (not illustrated) may be formed on the first substrate 110 by a chemical vapor deposition (CVD) process, a plasma enhanced CVD (PECVD) process, a low pressure chemical vapor deposition process, a sputtering process, and the like. Then, the semiconductor layer may be patterned to form preliminary semiconductor patterns (not illustrated) on the buffer layer 110. The preliminary semiconductor patterns may be crystallized by a laser irradiation process, a thermal annealing process, a catalyst-aided thermal annealing process, and the like. Hence, the semiconductor patterns 120 may be obtained on the buffer layer 110. When the semiconductor layer includes amorphous silicon, each of the semiconductor patterns 120 may include polysilicon.

In some embodiments, a dehydrogenation process may be performed about the semiconductor layer and/or the preliminary semiconductor patterns. In the dehydrogenation process, hydrogen atoms may be removed from the semiconductor layer and/or the preliminary semiconductor patterns. That is, the semiconductor layer and/or the preliminary semiconductor patterns may have reduced concentration of hydrogen. Thus, the semiconductor patterns 120 may ensure improved electrical characteristics.

Figure 5:
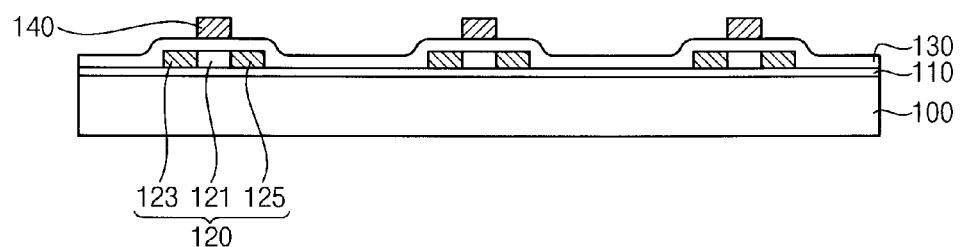

Referring to FIG. 5, a gate insulation layer 130 may be formed on the buffer layer 110 to cover the semiconductor patterns 120. The gate insulation layer 130 may be formed by a chemical vapor deposition process, a spin coating process, a plasma enhanced chemical vapor deposition process, a sputtering process, a vacuum evaporation process, a high density plasma-chemical vapor deposition (HDP-CVD) process, a printing process, and the like. The gate insulation layer 130 may be formed using silicon oxide, metal oxide, and the like. Examples of metal oxide in the gate insulation layer 130 may include hafnium oxide, aluminum oxide, zirconium oxide, titanium oxide, tantalum oxide, and the like. These may be used alone or in a combination thereof.

The gate insulation layer 130 may be conformally formed on the buffer layer 110 along profiles of the semiconductor patterns 120. When the gate insulation layer 130 has a relatively small thickness, the gate insulation layer 130 may have stepped portions formed adjacent to the semiconductor patterns 120. In some embodiments, the gate insulation layer 130 may have a relatively large thickness, so that the gate insulation layer 130 may have a substantially level upper face to sufficiently cover the semiconductor patterns 120.

Gate electrodes 140 may be formed on the gate insulation layer 130. The gate electrodes 140 may be positioned on portions of the gate insulation layer 130 under which the semiconductor patterns 120 are located. In some embodiments, a first conductive layer (not illustrated) may be formed on the gate insulation layer 130, and then the first conductive layer may be patterned by a photolithography process or an etching process using an additional etching mask, to thereby form the gate electrodes 140 on the gate insulation layer 130. The first conductive layer may be formed by a sputtering process, a printing process, a chemical vapor deposition process, a pulsed laser deposition (PLD) process, an atomic layer deposition (ALD) process, and the like.

Each of the gate electrodes 140 may be formed using metal, alloy, metal nitride, conductive metal oxide, a transparent conductive material, and the like. In some embodiments, the gate electrodes 140 may be formed using aluminum, alloy including aluminum, aluminum nitride (AlNx), silver (Ag), alloy including silver, tungsten (W), tungsten nitride (WNx), copper (Cu), alloy including copper, nickel (Ni), chrome (Cr), chrome nitride (CrOx), molybdenum (Mo), alloy including molybdenum, titanium, titanium nitride (TiNx), platinum (Pt), tantalum (Ta), tantalum nitride (TaNx), neodymium (Nd), scandium (Sc), strontium ruthenium oxide (SrRuxOy), zinc oxide (ZnOx), indium tin oxide (ITO), tin oxide (SnOx), indium oxide (InOx), gallium oxide (GaOx), indium zinc oxide (IZO), and the like. These may be used alone or in a combination thereof. In some embodiments, each of the gate electrodes 140 may have a single-layered structure including a metal film, an alloy film, a metal nitride film, a conductive metal oxide film or a transparent conductive material film. In some embodiments, each gate electrode 140 may have a multi-layered structure including a metal film, an alloy film, a metal nitride film, a conductive metal oxide film and/or a transparent conductive material film.

A gate line (not illustrated) may be formed on the gate insulation layer 130. The gate line may be connected to the gate electrodes 140. The gate line may extend on the gate insulation layer 130 along a first direction. The gate line may be formed using a material substantially the same as that for each gate electrode 140.

Impurities may be implanted into the semiconductor patterns 120 using the gate electrodes 140 as ion implantation masks, so that source regions 123 and drain regions 125 may be formed at lateral portions of the semiconductor patterns 120. As ion implantation energy of an ion implantation process increases, the impurities may be penetrated through the gate insulation layer 130 and may be implanted into the lateral portions of the semiconductor patterns 120. The impurities may not be doped into central portions of the semiconductor patterns 120 on which the gate electrodes 140 are located. Thus, the central portions of the semiconductor patterns 120 may serve as channel regions 121 of thin film transistors. Each channel region 121 may be positioned between each source region 123 and each drain region 125. That is, the channel regions 121 of the semiconductor patterns 120 may be defined by the source and the drain regions 123 and 125. In some embodiments, a mask may be placed on the gate insulation layer 130 to expose portions of the gate insulation layer 130 adjacent to the gate electrodes 140, and then the mask and the gate electrodes 140 may be used as ion implantation masks for forming the source regions 123 and the drain regions 125.

In some embodiments, the gate electrodes 140 may have widths substantially smaller than those of the semiconductor patterns 120, respectively. Each of the gate electrodes 140 may have a width substantially the same as or substantially similar to that of each channel region 121. In other embodiments, dimensions of the gate electrodes 140 and/or the channel regions 121 may vary in accordance with required electrical characteristics of the thin film transistors.

Figure 6:
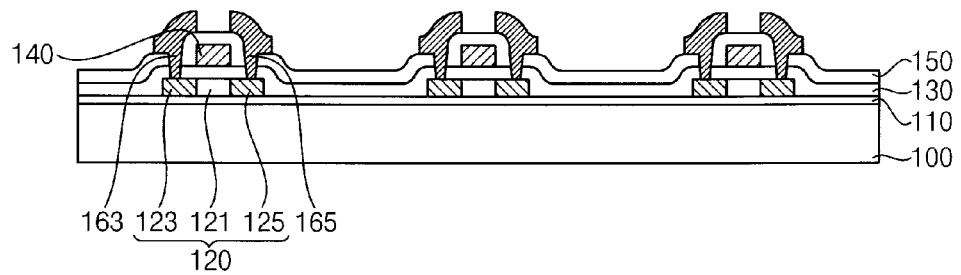

Referring to FIG. 6, a first insulating interlayer 150 may be formed on the gate insulation layer 130 to cover the gate electrodes 140. The first insulating interlayer 150 may be conformally formed along profiles of the gate electrodes 140. Thus, the first insulating interlayer 150 may have stepped portions adjacent to the gate electrodes 140. The first insulating interlayer 150 may be formed using silicon compound. In some embodiments, the first insulating interlayer 150 may be formed using silicon oxide, silicon nitride, silicon oxynitride, silicon carbonitride, silicon oxycarbide, and the like. These may be used alone or in a combination thereof. The first insulating interlayer 150 may have a single-layered structure or a multi-layered structure. Further, the first insulating interlayer 150 may be formed by a spin coating process, a chemical vapor deposition process, a plasma enhanced chemical vapor deposition process, a high density plasma-chemical vapor deposition process, and the like. The first insulating interlayer 150 may electrically insulate the gate electrodes 140 from source electrodes 163 and drain electrodes 165, which may be formed in subsequent processes.

The source and the drain electrodes 163 and 165 may be formed on the first insulating interlayer 150. Each of the source and the drain electrodes 163 and 165 may be separated from each other by a predetermined distance centering each gate electrode 140. In some embodiments, the source and the drain electrodes 163 and 165 may extend from portions of the first insulating interlayer 150 on the source and the drain regions 123 and 125 toward portions of the first insulating interlayer 150 on the gate electrodes 140. The source and the drain electrodes 163 and 165 may be electrically connected to the source and the drain regions 123 and 125 through the first insulating interlayer 150, respectively.

In some embodiments, the first insulating interlayer 150 may be partially etched to form openings that partially expose the source and the drain regions 123 and 125, respectively. After a second conductive layer (not illustrated) is formed on the first insulating interlayer 150 to fill the openings, the second conductive layer may be patterned to form the source and the drain electrodes 163 and 165 as illustrated in FIG. 6. The second conductive layer may be formed by a sputtering process, a chemical vapor deposition process, a pulsed laser deposition process, a vacuum evaporation process, an atomic layer deposition process, and the like. The source and the drain electrodes 163 and 165 may include metal, alloy, metal nitride, conductive metal oxide and/or a transparent conductive material. The source and drain electrodes 163 and 165 may be formed using aluminum, alloy including aluminum, aluminum nitride (AlNx), silver (Ag), alloy including silver, tungsten (W), tungsten nitride (WNx), copper (Cu), alloy including copper, nickel (Ni), chrome (Cr), chrome nitride (CrOx), molybdenum (Mo), alloys including molybdenum, titanium, titanium nitride (TiNx), platinum (Pt), tantalum (Ta), tantalum nitride (TaNx), neodymium (Nd), scandium (Sc), strontium ruthenium oxide (SrRuxOy), zinc oxide (ZnOx), indium tin oxide (ITO), tin oxide (SnOx), indium oxide (InOx), gallium oxide (GaOx), indium zinc oxide (IZO), and the like. These may be used alone or in a combination thereof. Each of the source and the drain electrodes 163 and 165 may have a single-layered structure or a multi-layered structure. As a result, the thin film transistors including the semiconductor patterns 120, the gate insulation layer 130, the gate electrodes 140, the source electrodes 163 and the drain electrodes 165 may be provided on the first substrate 100.

A data line (not illustrated) extending in a second direction may be formed on the first insulating interlayer 150. The second direction may be substantially perpendicular to the first direction in which the gate line may extend. The data line may be connected to the source electrodes 163 of the thin film transistors.

Figure 7:
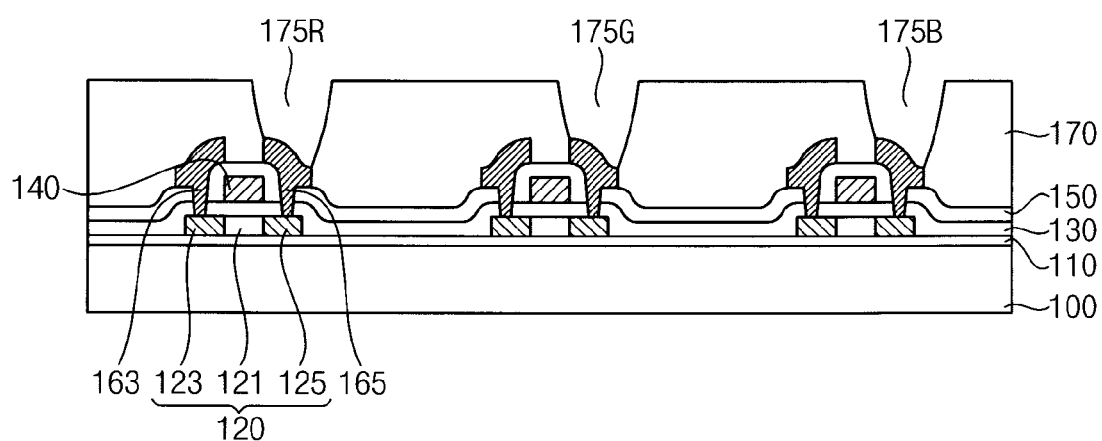

Referring to FIG. 7, a second insulating interlayer 170 may be formed on the first insulating interlayer 150 to cover the source and drain electrodes 163 and 165. The second insulating interlayer 170 may have a relatively large thickness to sufficiently cover the source and the drain electrodes 163 and 165. The second insulating interlayer 170 may be formed using an organic material or an inorganic material. The second insulating interlayer 170 may be formed using photoresist, acryl-based polymer, polyimide-based resin, polyamide-based resin, siloxane-based resin, resin containing photosensitive acryl carboxyl group, novolac resin, alkali-soluble resin, silicon oxide, silicon nitride, silicon oxynitride, silicon oxycarbide, silicon carbonitride, aluminum, magnesium, zinc, hafnium, zirconium, titanium, tantalum, aluminum oxide, titanium oxide, tantalum oxide, magnesium oxide, zinc oxide, hafnium oxide, zirconium oxide, and the like. These may be used alone or in a combination thereof. The second insulating interlayer 170 may be formed by a spin coating process, a printing process, a sputtering process, a chemical vapor deposition process, an atomic layer deposition process, a plasma enhanced chemical vapor deposition process, a high density plasma-chemical vapor deposition process, a vacuum evaporation process, and the like.

A first contact hole 175R, a second contact hole 175G and a third contact hole 175B may be formed through the second insulating interlayer 170 to expose portions of the drain electrodes 165, respectively. When the second insulating interlayer 170 includes a photosensitive material, the first to the third contact holes 175R, 175G and 175 B may be formed by an exposure process and a developing process without performing additional processes such as a mask forming process, an etching process, a cleaning process, and the like. A photosensitive material may be deposited on the source and the drain electrodes 163 and 165 and the first insulating interlayer 150 by a spin coating process, a printing process, a spreading process, and the like. Then, the deposited photosensitive material may be exposed to light using a mask having a predetermined pattern. The mask may include a transmissive region and a light blocking region. When the photosensitive material is a positive-type photosensitive material, the transmissive region of the mask may be positioned on portions of the second insulating interlayer 170 through which the first to the third contact holes 175, 175G and 175B may be formed. The portions of the second insulating interlayer 170 may be exposed to light, and then the exposed portions of the second insulating interlayer 170 may be removed by a developing process. When the photosensitive material has a negative type, the light blocking region of the mask may be placed on the portions of the second insulating interlayer 170 through which the first to the third contact holes 175R, 175G and 175B may be formed. Then, an exposure process and a developing process may be performed about the exposed portions of the second insulating interlayer 170 using the mask. Therefore, the first to the third contact holes 175R, 175G and 175B exposing the drain electrodes 165 may be formed through the second insulating interlayer 170.

When the second insulating interlayer 170 includes an inorganic material, the first to the third contact holes 175R, 175G and 175B may be formed by a photolithography process. A photoresist pattern (not illustrated) may be formed on the second insulating interlayer 170, and then the first to the third contact holes 175R, 175G and 175B may be formed through the second insulating interlayer 170 using the photoresist pattern as an etching mask until the drain electrodes 165 may be exposed.

Figure 8:
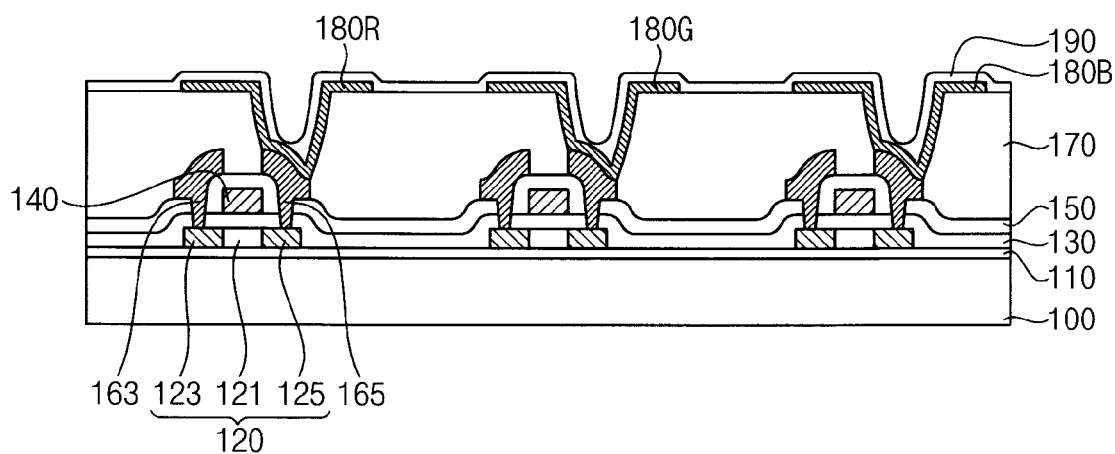

Referring to FIG. 8, first electrodes 180R, 180G and 180G electrically contacting the drain electrodes 165 may be formed on the second insulating interlayer 170 and on sidewalls of the first to the third contact holes 175R, 175G and 175B.

Each of the first electrodes 180R, 180G and 180B may be formed using a reflective material when the organic light emitting display device has a top emission type. The first electrodes 180R, 180G and 180B may be formed using aluminum, silver, platinum, gold, chrome, tungsten, molybdenum, titanium, palladium, iridium, and the like. These may be used alone or in a mixture thereof. Further, each of the first electrodes 180R, 180G and 180B may have a single-layered structure or a multi-layered structure.

In some embodiments, a first electrode layer (not illustrated) may be formed on the second insulating interlayer 170 and on the sidewalls of the first to the third contact holes 175R, 175G and 175B exposing the drain electrodes 165. Then, the first electrode layer may be patterned to form the first electrodes 180R, 180G and 180B on the second insulating interlayer 170 and on the drain electrodes 165. The first electrode layer may be formed by a sputtering process, a vacuum evaporation process, a chemical vapor deposition process, a pulsed laser deposition process, a printing process, an atomic layer deposition process, and the like. The first electrodes 180R, 180G and 180B may respectively extend on portions of non-luminescent regions adjacent to luminescent regions of the organic light emitting display device.

A pixel defining layer 190 may be formed on the second insulating interlayer 170 and portions of the first electrodes 180R, 180G and 180B. Portions of the first electrodes 180R, 180G and 180B on which the pixel defining layer 190 is not formed may be defined as the luminescent regions (corresponding to reference numerals 20R, 20G and 20B in FIG. 1) of the organic light emitting display device. The pixel defining layer 190 may be formed using an organic material or an inorganic material. The pixel defining layer 190 may be formed using acryl-based resin, polyimide-based resin, polyamide-based resin, siloxane-based resin, resin containing photosensitive acryl carboxyl group, novolac resin, alkali-soluble resin, silicon oxide, silicon nitride, silicon oxynitride, silicon oxycarbide, silicon carbonitride, aluminum, magnesium, zinc, hafnium, zirconium, titanium, tantalum, aluminum oxide, titanium oxide, tantalum oxide, magnesium oxide, zinc oxide, hafnium oxide, zirconium oxide, and the like.

Figure 9:
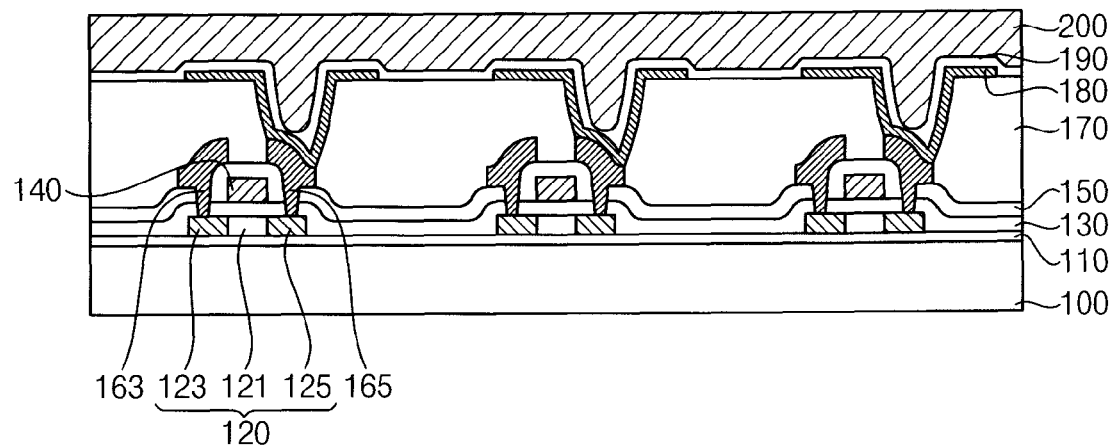
Figure 10:
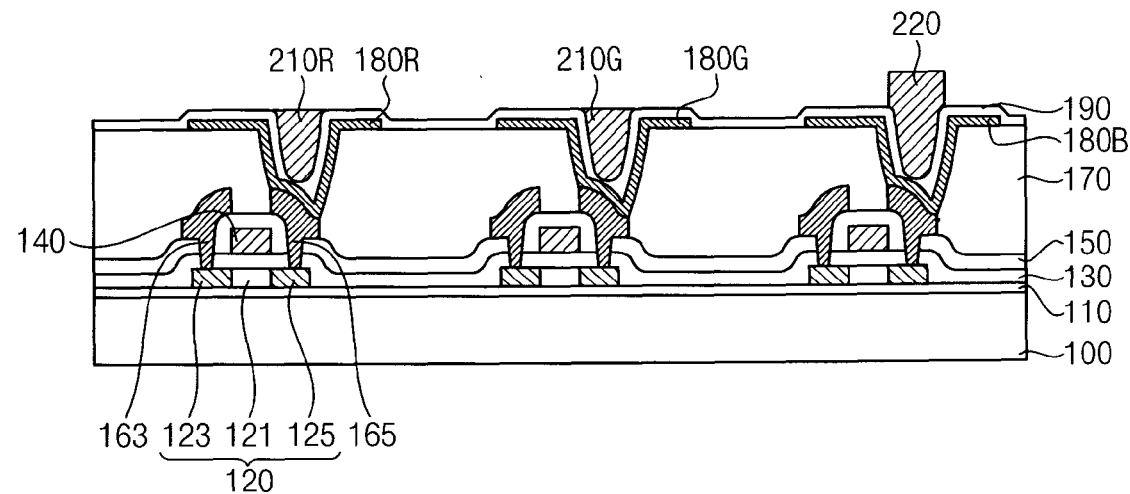

Referring to FIGS. 9 and 10, a planarization layer 200 may be formed on the first electrodes 180R, 180G and 180B and on the pixel defining layer 190. The planarization layer 200 may be formed using acryl-based resin, polyimide-based resin, polyamide-based resin, siloxane-based resin, polymer containing photosensitive acryl carboxyl group, novolace resin, alkali-soluble resin, and the like.

The planarization layer 200 may be patterned by an etching process using a half-tone mask 300 or a half-tone slit mask, to form a first planarization pattern 210R and a second planarization pattern 210G substantially filling the first and the second contact holes 175R and 175G, respectively. Simultaneously, a spacer 220 may be formed on the pixel defining layer 190 to substantially fill the third contact hole 175B.

In some embodiments, the half-tone mask 300 may have a plurality of regions having different light transmittances. The half-tone mask 300 may include transmissive regions (I), transflective regions (II) and a light blocking region (III). The half-tone mask 300 illustrated in FIG. 9 may be used in patterning the planarization layer 200 when the planarization layer 200 includes a positive-type photosensitive material.

In some embodiments, the half-tone mask 300 may include transflective regions (II) substantially corresponding to the first and the second contact holes 175R and 175G, and may include a light blocking region (III) substantially corresponding to the third contact hole 175B. Transmissive regions (I) of the half-tone mask 300 may correspond to portions of the pixel defining layer 190 where the first to third contact holes 175R, 175G and 175B are not located. When the planarization layer 200 including positive-type photosensitive material is exposed to light, exposed portions of the photosensitive material may have decomposed or broken chemical bonds, or have increased solubility to a predetermined solution, so that the exposed portions of the photosensitive material may be removed by a developing process.

Portions of the planarization layer 200 in the first contact hole 175R and the second contact hole 175B may be partially removed using the transflective regions (II) of the half-tone mask 300, so that the portions of the planarization layer 200 may remain with predetermined thicknesses. By adjusting light transmittances of the transflective regions (II) and/or light exposure time for the planarization layer 200, an exposure process may be carried out until the planarization layer 200 in the first and the second contact holes 175R and 175G may have upper faces substantially coplanar with an upper face of the pixel defining layer 190. Therefore, the first and the second planarization patterns 210R and 210G may be formed in the first and the second contact holes 175R and 175G, respectively. The first and the second contact holes 175R and 175G may be substantially filled with the first and the second planarization patterns 210R and 210G.

A portion of the planarization layer 200 in the third contact hole 175B may not be exposed to light because of the light blocking region (III) of the half-tone mask 300, so that the portions of the planarization layer 200 in the third contact hole 175B may keep original thickness. Exposed portions of the planarization layer 200, where the first to the third contact holes 175R, 175G and 175B are not located, may be removed because of the transmissive regions (I) of the half-tone mask 300, such that the spacer 220 may be formed in the third contact hole 175B. The spacer 220 in the third contact hole 175B may have an upper face substantially higher than the upper face of the pixel defining layer 190. The spacer 220 may protrude over the pixel defining layer 190. The upper face of the spacer 220 may be substantially higher than that of the second electrode 240 which may be formed on the pixel defining layer 190 in a subsequent process.

In some embodiments, the first and the second planarization patterns 210R and 210G may have levels substantially that same as or similar to that of the upper face of the pixel defining layer 190. The first and the second planarization patterns 210R and 210G may be formed on the first and the second contact holes 175R and 175G, respectively. Hence, the pixel defining layer 190 in the first and the second contact holes 175R and 175G may not have a height difference. As a result, light emitting structures 230 may be uniformly and effectively transferred on the first electrodes 180 and on the pixel defining layer 190 without failures of the light emitting structures 230 when the light emitting structures 230 are obtained by a laser induced thermal imaging process. Further, the organic light emitting display device including first and the second planarization patterns 210R and 210G may have improved uniform pixels.

In some embodiments, the spacer 220 may substantially protrude over the pixel defining layer 190, a predetermined gap may be provided between the first substrate 100 and a second substrate (not illustrated) combined with the first substrate 100. The organic light emitting display device may not be damaged because of the spacer 200 even though pressure or stress may be applied to the second substrate. Therefore, the organic light emitting display device including the spacer 220 may ensure enhanced structural stability.

When the planarization layer 200 includes a negative-type photosensitive material, the half-tone mask 300 may have a transmissive region corresponding to the third contact hole 175B, transflective regions corresponding to the first and the second contact holes 175R and 175G, and a light blocking region corresponding to a portion of the pixel defining layer 190 where the first to the third contact holes 175R, 175G and 175B are not located. In case that the planarization layer 200 includes the negative-type photosensitive material, exposed portions of the photosensitive material may be cured or hardened by cross link or polymerization, such that unexposed portions of the photosensitive material may be removed by a developing process. The portions of the planarization layer 200 where the first to the third contact holes 175R, 175G and 175B are not located may be removed, whereas the planarization layer 200 in the third contact hole 175B may not be removed. Thus, the spacer 220 may be formed on the first electrode 180 to fill the third contact hole 175B. Remaining portions of the planarization layer 200 in the first and the second contact holes 175R and 175G may have upper faces substantially coplanar with the upper face of the pixel defining layer 190, so that the first and the second planarization patterns 210R and 210G may be formed in the first and the second contact holes 175R and 175G, respectively.

The light emitting structures 230 may be formed on the pixel defining layer 190 in the luminescent regions and the first electrodes 180. Lower portions of the light emitting structures 230 may be positioned on the first electrodes 180 and lateral portions of the light emitting structures 230 may be in contact with the pixel defining layer 190. In some embodiments, each of the light emitting structures 230 may have a multi-layered structure that includes an emission layer (EL), a hole injection layer (HIL), a hole transporting layer (HTL), an electron transporting layer (ETL) and an electron injection layer (EIL). The light emitting structures 230 in sub-pixel regions may be formed using luminescent materials for emitting different colors of light, i.e., a red color of light, a green color of light and a blue color of light. In some embodiments, each light emitting structure 230 may have a multi-layered structure having a plurality of layers containing luminescent materials stacked to thereby emit a white color of light.

As illustrated in FIG. 3, the second electrode 240 may be formed on the light emitting structures 230 and the pixel defining layer 190. The second electrode 240 may have a thickness substantially uniform on the light emitting structures 230 and the pixel defining layer 190. When the organic light emitting display device has a top emission type, the second electrode 240 may be formed using a transparent conductive material. The second electrode 240 may be formed using indium tin oxide, indium zinc oxide, zinc tin oxide, zinc oxide, tin oxide, gallium oxide, and the like. These may be used alone or in a combination thereof.

In some embodiments, the second electrode 240 may extend from the luminescent regions to the non-luminescent regions. In some embodiments, the second electrode 240 may be formed only in the luminescent regions. The second electrode 240 may be formed on the light emitting structures 230 and portions of the pixel defining layer 190 (such as, for example, sidewalls of the openings formed through the pixel defining layer 190). In some embodiments, a second electrode layer (not illustrated) may be formed on the light emitting structures 230 and the pixel defining layer 190, and then the second electrode layer may be patterned to form the second electrode 240 in the luminescent regions.

A protection layer (not illustrated) may be additionally formed on the second electrode. The protection layer may also extend from the luminescent regions to the non-luminescent regions. The protection layer may be formed using an organic material or an inorganic material. The protection layer may be formed using acryl-based resin, polyimide-based resin, polyamide-based resin, siloxane-based resin, polymer including photosensitive acryl carboxyl group, novolac resin, alkali-soluble resin, silicon oxide, silicon nitride, silicon oxynitride, silicon oxycarbide, silicon carbonitride, aluminum, magnesium, zinc, hafnium, zirconium, titanium, tantalum, aluminum oxide, titanium oxide, tantalum oxide, magnesium oxide, zinc oxide, hafnium oxide, zirconium oxide, and the like. Further, the protection layer may be formed by a spin coating process, a printing process, a sputtering process, a chemical vapor deposition process, an atomic layer deposition process, a plasma enhanced chemical vapor deposition process, a high density plasma-chemical vapor deposition process, a vacuum evaporation process, and the like.

The second substrate (not illustrated) may be provided on the first substrate 100 by interposing the protection layer and the spacer 220 therebetween. The second substrate may include a transparent insulation substrate such as glass, transparent plastic, transparent ceramic, and the like. In some embodiments, a gap between the first substrate 100 and the second substrate in the luminescent regions may be filled with air and/or an inert gas such as a nitrogen gas. In some embodiments, the gap may be filled with a light transmissive material including hygroscopic property.

The organic light emitting display device according to some embodiments may include the first and the second planarization patterns 210R and 210G substantially filling the first and the second contact holes 175R and 175G, and may include the spacer 220 substantially filling the third contact hole 175B. Thus, the height difference of the pixel defining layer 190 around the first to the third contact holes 175R, 175G and 175B may be prevented or considerably reduced. When the light emitting structures 230 are obtained by a laser induced thermal imaging process, the organic transfer layer of the donor substrate may be uniformly and effectively transferred on the first electrodes 180 and the pixel defining layer 190. Therefore, the organic light emitting display device may have uniform pixels without failure of the light emitting structures 230 because of the first and the second planarization patterns 210R and 210G. Additionally, the organic light emitting display device may ensure improved structural stability because of the spacer 220. Furthermore, the first and the second planarization patterns 210R and 210G and the spacer 220 may be formed simultaneously, so that manufacturing processes for the organic light emitting display device may be simplified.

According to some embodiments, an organic light emitting display device may include planarization patterns and a spacer substantially filling contact holes in pixel regions. Thus, the organic light emitting display device may include uniform light emitting structures in the pixel regions without failures of the light emitting structures. Additionally, the organic light emitting display device may have enhanced structural stability because of the spacer interposed between two substrates.

The foregoing is illustrative of some embodiments and is not to be construed as limiting thereof. Although a few embodiments have been described, those skilled in the art will readily appreciate that many modifications are possible in the embodiments without materially departing from the novel teachings and advantages of the invention. Accordingly, all such modifications are intended to be included within the scope of the invention as defined in the claims. In the claims, means-plus-function clauses are intended to cover the structures described herein as performing the recited function and not only structural equivalents but also equivalent structures. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:
1. An organic light emitting display device comprising:
   thin film transistors on a substrate;

an insulating interlayer on the thin film transistors, the insulating interlayer having a first contact hole, a second contact hole and a third contact hole, wherein the first to the third contact holes partially expose the thin film transistors, respectively;

first electrodes disposed on the insulating interlayer and sidewalls of the first to the third contact holes, the first electrodes being electrically connected to the thin film transistors;

a pixel defining layer disposed on the insulating interlayer, portions of the first electrodes and the sidewalls of the first to the third contact holes, the pixel defining layer defining pixel regions;

light emitting structures on the first electrodes in the pixel regions;

a second electrode on the light emitting structures;

planarization patterns on the pixel defining layer, the planarization patterns filling the first and the second contact holes; and a spacer on the pixel defining layer, the spacer filling the third contact hole.

2. The organic light emitting display device of claim 1, wherein an upper face of the spacer is higher than upper faces of the planarization patterns.

3. The organic light emitting display device of claim 1, wherein upper faces of the planarization patterns are coplanar with an upper face of the pixel defining layer.

4. The organic light emitting display device of claim 1, wherein the spacer and the planarization patterns include a material in common.

5. The organic light emitting display device of claim 1, wherein each of the thin film transistors comprises:
a semiconductor pattern on the substrate, the semiconductor pattern having a channel region, a source region and a drain region;
a gate insulation layer on the semiconductor pattern;
a gate electrode on the gate insulation layer;
a source electrode electrically connected to the source region; and
a drain electrode electrically connected to the drain region.

6. A method of manufacturing the organic light emitting display device of claim 1, the method comprising:
forming the thin film transistors on the substrate;
forming the insulating interlayer on the substrate to cover the thin film transistors;
forming the first contact hole, the second contact hole and the third contact hole through the insulating interlayer, the first to the third contact holes partially exposing electrodes of the thin film transistors, respectively;
forming the first electrodes on the insulating interlayer, the sidewalls of the first to the third contact holes and exposed electrodes of the thin film transistors;
forming the pixel defining layer on the insulating interlayer to expose portions of the first electrodes;
forming a first planarization pattern and a second planarization pattern on the pixel defining layer to fill the first and the second contact holes, respectively;
forming the light emitting structures on exposed portions of the first electrodes; and
forming the second electrode on the light emitting structures.

7. The method of claim 6, wherein forming the first and the second planarization patterns comprises:
forming a planarization layer on the pixel defining layer to fill the first contact hole and the second contact hole; and
patterning the planarization layer using a half-tone mask to form the first and the second planarization patterns.

8. The method of claim 7, wherein the first and the second planarization patterns have level upper faces.

9. The method of claim 6, further comprising forming a spacer to fill the third contact hole, wherein forming a spacer comprises:
forming the planarization layer on the pixel defining layer to fill the third contact hole; and
patterning the planarization layer to form the spacer that fills the third contact hole and protrudes over the third contact hole.

10. The method of claim 9, wherein an upper face of the spacer is higher than upper faces of the first and the second planarization patterns.

11. The method of claim 9, wherein forming the first and the second planarization patterns and forming the spacer comprise:
forming the planarization layer on the pixel defining layer to fill the first to the third contact holes; and
patterning the planarization layer using a half-tone mask to form the first and the second planarization patterns in the first and the second contact holes, and to form the spacer in the third contact hole.

12. The method of claim 11, wherein the planarization layer is formed using a photosensitive material.

13. The method of claim 12, wherein the half-tone mask includes a transmissive region, a light blocking region and transflective regions.

14. The method of claim 13, wherein the planarization layer is formed using a positive photosensitive material, and
wherein the transflective regions correspond to the first and the second contact holes, the light blocking region corresponds to the third contact hole, and the transmissive region corresponds to a portion of the pixel defining layer where the first to the third contact holes are not formed.

15. The method of claim 13, wherein the planarization layer is formed using a negative photosensitive material, and
wherein the transflective regions correspond to the first and the second contact holes, the transmissive region corresponds to the third contact hole, and the light blocking region corresponds to a portion of the pixel defining layer where the first to third contact holes are not formed.

16. The method of claim 7, wherein upper faces of the first and the second planarization patterns are coplanar with an upper face of the pixel defining layer adjacent to the first and the second contact holes, and
wherein an upper face of the spacer is higher than an upper face of the pixel defining layer adjacent to the third contact hole.

17. An organic light emitting display device comprising:
a substrate having a red sub-pixel region, a green sub-pixel region and a blue sub-pixel region;
a red luminescent region and a first contact hole disposed in the red sub-pixel region;
a green luminescent region and a second contact hole disposed in the green sub-pixel region;
a blue luminescent region and a third contact hole disposed in the blue sub-pixel region;
a first planarization pattern and a second planarization pattern filling the first and the second contact holes, respectively, the first and the second planarization patterns having heights same as those of the first and the second contact holes; and
a spacer filling the third contact hole, the spacer protruding over the third contact hole.

18. The organic light emitting display device of claim 17, further comprising thin film transistors disposed on the substrate.

19. The organic light emitting display device of claim 17, wherein the spacer and the first and the second planarization patterns include a material in common.

20. The organic light emitting display device of claim 19, wherein each of the spacer and the first and the second planarization patterns includes a photosensitive material.

* * * * *